(12) United States Patent
Burak et al.

(10) Patent No.: US 10,284,173 B2
(45) Date of Patent: May 7, 2019

(54) ACOUSTIC RESONATOR DEVICE WITH AT LEAST ONE AIR-RING AND FRAME

(71) Applicant: Avago Technologies General IP (Singapore) Pte. Ltd., Singapore (SG)

(72) Inventors: Dariusz Burak, Fort Collins, CO (US); Phil Nikkel, Loveland, CO (US); David Martin, Fort Collins, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 303 days.

(21) Appl. No.: 15/196,657

(22) Filed: Jun. 29, 2016

(65) Prior Publication Data

US 2016/0308509 A1 Oct. 20, 2016

Related U.S. Application Data

(63) Continuation-in-part of application No. 14/192,599, filed on Feb. 27, 2014, now Pat. No. 9,571,064, and a continuation-in-part of application No. 13/660,941, filed on Oct. 25, 2012, now Pat. No. 9,425,764, and a continuation-in-part of application No. 13/151,631, filed on Jun. 2, 2011, now Pat. No. 9,203,374, and a continuation-in-part of application No. 13/074,262, filed on Mar. 29, 2011, now Pat. No. 9,136,818, and a continuation-in-part of application No. 13/036,489, filed on Feb. 28, 2011, now Pat. No. 9,154,112.

(51) Int. Cl.
*H01L 41/08* (2006.01)
*H03H 9/17* (2006.01)
*H03H 9/13* (2006.01)
*H03H 9/02* (2006.01)

(52) U.S. Cl.
CPC ............ *H03H 9/173* (2013.01); *H03H 9/132* (2013.01); *H03H 9/02007* (2013.01)

(58) Field of Classification Search
CPC .............................. H03H 9/173; H03H 9/132
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin et al. |
| 6,384,697 B1 | 5/2002 | Ruby et al. |
| 6,507,983 B1 | 1/2003 | Ruby et al. |
| 6,548,943 B2 | 4/2003 | Kaitila et al. |

(Continued)

*Primary Examiner* — J. San Martin

(57) ABSTRACT

An acoustic resonator device includes a bottom electrode disposed on a substrate over an air cavity, a piezoelectric layer disposed on the bottom electrode, and a top electrode disposed on the piezoelectric layer, where an overlap between the top electrode, the piezoelectric layer and the bottom electrode over the air cavity defines a main membrane region. The acoustic resonator device further includes at least one metal frame disposed on a bottom surface of the bottom electrode having a thickness that ranges from about 10% to about 75% of a thickness of the bottom electrode in a central region of the bottom electrode. The thickness of the metal frame improves heat dissipation out of the acoustic resonator device while also improving structural stability of the acoustic resonator device without detrimentally affecting its performance.

31 Claims, 14 Drawing Sheets

(56) References Cited

U.S. PATENT DOCUMENTS

| | | |
|---|---|---|
| 6,936,837 B2 | 8/2005 | Yamada et al. |
| 7,164,222 B2 | 1/2007 | Wang |
| 7,275,292 B2 | 10/2007 | Ruby et al. |
| 7,280,007 B2 | 10/2007 | Feng et al. |
| 7,345,410 B2 | 3/2008 | Grannen et al. |
| 7,369,013 B2 * | 5/2008 | Fazzio ............... H03H 9/02149 310/312 |
| 7,388,454 B2 | 6/2008 | Ruby et al. |
| 7,602,102 B1 * | 10/2009 | Barber ..................... H03H 3/02 310/320 |
| 7,629,865 B2 | 12/2009 | Ruby et al. |
| 7,714,684 B2 | 5/2010 | Ruby et al. |
| 8,896,395 B2 | 11/2014 | Burak et al. |
| 8,981,876 B2 | 3/2015 | Jamneala et al. |
| 9,099,983 B2 | 8/2015 | Burak et al. |
| 9,136,819 B2 | 9/2015 | Grannen et al. |
| 9,148,117 B2 * | 9/2015 | Burak ....................... H03H 3/04 |
| 9,225,313 B2 | 12/2015 | Bradley et al. |
| 9,246,473 B2 | 1/2016 | Burak et al. |
| 9,444,426 B2 * | 9/2016 | Burak ..................... H03H 9/132 |
| 9,748,918 B2 * | 8/2017 | Burak ................ H03H 9/02102 |
| 9,991,871 B2 * | 6/2018 | Zou ....................... H01L 41/047 |
| 2010/0327697 A1 * | 12/2010 | Choy et al. ........ H03H 9/02118 310/335 |
| 2013/0106534 A1 | 5/2013 | Burak et al. |
| 2014/0111288 A1 | 4/2014 | Nikkei et al. |
| 2014/0118088 A1 | 5/2014 | Burak et al. |
| 2014/0118091 A1 | 5/2014 | Burak et al. |
| 2014/0225683 A1 | 8/2014 | Burak et al. |
| 2015/0318837 A1 | 11/2015 | Zou et al. |
| 2015/0349747 A1 * | 12/2015 | Burak ..................... H03H 9/173 333/187 |
| 2016/0126930 A1 | 5/2016 | Zou et al. |
| 2017/0047907 A1 * | 2/2017 | Burak ..................... H03H 9/585 |
| 2018/0085787 A1 * | 3/2018 | Burak .................. B06B 1/0644 |

\* cited by examiner

ACOUSTIC RESONATOR DEVICE WITH AT LEAST ONE AIR-RING AND FRAME

CROSS REFERENCE TO RELATED APPLICATIONS

This application is a continuation-in-part under 37 C.F.R. § 1.53(b) of commonly owned U.S. patent application Ser. No. 14/192,599 to Burak et al. entitled "Acoustic Resonator Device With At Least One Air-Ring And Frame," filed on Feb. 27, 2014 (now published as U.S. Patent Application Publication No. 2014/0176261), which is a continuation-in-part of commonly owned U.S. patent application Ser. No. 13/151,631 to Burak et al. entitled "Film Bulk Acoustic Resonator Comprising a Bridge," filed on Jun. 2, 2011 (now issued as U.S. Pat. No. 9,203,374), which is a continuation-in-part of commonly owned U.S. patent application Ser. No. 13/074,262 to Burak et al., entitled "Stacked Acoustic Resonator Comprising a Bridge," filed on Mar. 29, 2011 (now issued as U.S. Pat. No. 9,136,818), which is a continuation-in-part of commonly owned U.S. patent application Ser. No. 13/036,489 to Burak, entitled "Coupled Resonator Filter Comprising Bridge" filed on Feb. 28, 2011 (now issued as U.S. Pat. No. 9,154,112), which are hereby incorporated by reference in their entireties. This application is a continuation-in-part under 37 C.F.R. § 1.53(b) of commonly owned U.S. patent application Ser. No. 13/660,941 to Burak et al. entitled "Acoustic Resonator having Composite Electrodes with Integrated Lateral Features," filed on Oct. 25, 2012, (now published as U.S. Patent Application Publication No. 2014/0118088), which is hereby incorporated by reference in its entirety.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of acoustic energy confined in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, an air-bridge may be formed under the top electrode on the top electrode connecting edge of the acoustic resonator in order to eliminate the transducer effect over the substrate. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Also, some design choices may produce only modest performance improvements while significantly driving up cost. Moreover, the formation of ancillary structural features may degrade structural stability or interfere with the formation of overlying layers.

In addition, conventional FBARs rely on an air interface being present both on bottom and top side of the resonator. In contrast to SMRs, an air interface present on the bottom side of the resonator prevents parasitic acoustic energy leakage to the substrate and therefore improves the overall electrical performance of FBARs without the complexities associated with the design of a wide-band, solid-state acoustic mirror such as Distributed Bragg Reflector. On the other hand, however, lack of a solid connection of the active portion of the resonator with the substrate results in worse heat removal capabilities and weaker structural stability as compared to conventional SMR designs. Accordingly, in view of these and other shortcomings of conventional FBARs, there is a general need for improved acoustic resonator designs that address these issues without compromising the electrical performance of acoustic resonators and filters comprising these resonators.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
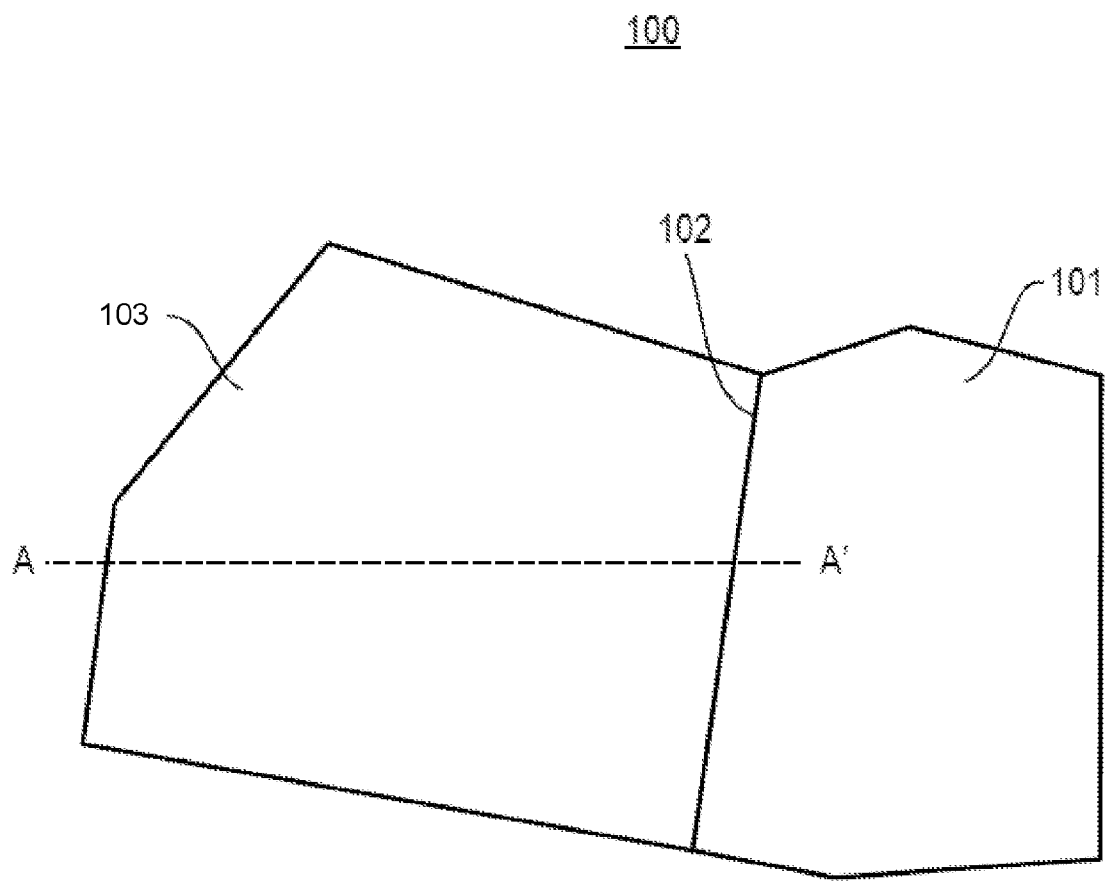
FIG. 1 is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), for example. For simplicity of explanation, several embodiments are described in the context of FBAR technologies; however, the described concepts can be adapted for use in other types of acoustic resonators. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. patent application Ser. No. 13/658,024 to Nikkel et al.; U.S. patent application Ser. No. 13/955,774 to Burak et al; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In a representative embodiment, an acoustic resonator device includes a bottom electrode disposed on a substrate over an air cavity, a piezoelectric layer disposed on the bottom electrode, and a top electrode disposed on the piezoelectric layer, where an overlap between the top electrode, the piezoelectric layer and the bottom electrode over the air cavity defines a main membrane region. The acoustic resonator device further includes at least one first metal frame disposed on a bottom surface of the bottom electrode having at least a first side and a second side and having a thickness that ranges from about 10% to about 70% of a thickness of the bottom electrode in a central region of the bottom electrode. Preferably the first metal frame has a thickness that ranges from 35% to 65% of the thickness of the bottom electrode in the central region of the bottom electrode. The thickness of the first metal frame facilitates the flow of heat out of the acoustic resonator device while also improving structural stability of the acoustic resonator device without detrimentally affecting its performance. Also, in accordance with preferred embodiments, the acoustic resonator device further includes a second metal frame disposed on the bottom surface of the bottom electrode. The second frame has a first side that extends laterally from an inner edge of the first side of the first metal frame to an outer edge of the central region of the bottom electrode. The second metal frame has a second side that extends laterally from an inner edge of the second side of the first metal frame to an outer edge of the central region of the bottom electrode. The second metal frame typically has a thickness that is approximately 50% the thickness of the first metal frame.

Generally, in various representative embodiments described below, an acoustic resonator comprises an acoustic stack formed by a piezoelectric layer disposed between top and bottom electrodes, disposed on a substrate over an air cavity. An overlap between the top electrode, the piezoelectric layer and the bottom electrode over the air cavity defines a main membrane region. One or more metal frames are formed on the bottom surface of the bottom electrode defining an active region within the main membrane region. In addition, one or more air-rings may be formed outside an outer boundary of the main membrane region. The air-ring(s) may be formed between the bottom electrode and the piezoelectric layer, between the piezoelectric layer and the top electrode, within the bottom electrode, within the top electrode, and/or within the piezoelectric layer. When an air-ring is formed between the piezoelectric layer and the top electrode, it comprises an air-bridge on the connection side of the top electrode and an air-wing along the remaining outside perimeter.

The first and second metal frames may be formed on the bottom surface of the bottom electrode by adding one or more layers of metallic material to the bottom surface of the bottom electrode. The metal frame can be either a composite metal frame or an add-on metal frame. A composite metal frame has integrated lateral features, possibly formed of aluminum (Al) and molybdenum (Mo), for example, and is formed by embedding different material within the bottom electrode, typically with a lower surface being coplanar with the lower surface of the bottom electrode. An add-on metal frame is formed by depositing the metallic material below a layer forming the bottom electrode along a perimeter of the active region. The use of a composite frame may simplify fabrication of the acoustic resonator with regard to application of layers on planar surfaces. For instance, it can prevent formation of outcroppings in overlying layers, which can preserve the structural stability of the acoustic resonator. A region of the acoustic resonator above the innermost metal frame and bordered by the innermost metal frame may be collectively referred to as a frame region.

The metal frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the active region. A metal frame that lowers the cutoff frequency in the frame region as compared to the active region may be referred to as a Low Velocity Frame (LVF), while a metal frame that increases the cutoff frequency in the frame region as compared to the main active region may be referred to as a High Velocity Frame (HVF). The reasoning behind this nomenclature is that for composite metal frames (for which thicknesses of the frame and active regions are substantially the same), an increase or decrease of the cutoff frequency is substantially equivalent to an increase or decrease of an effective sound velocity of the acoustic stack forming the frame, respectively.

A composite or add-on metal frame with lower effective sound velocity than the corresponding effective sound velocity of the active region (i.e., an LVF) generally increases parallel resistance Rp and Q-factor of the acoustic resonator above the cutoff frequency of the active region. Conversely, a composite or add-on metal frame with a higher effective sound velocity than the corresponding effective sound velocity of the active region (i.e., an HVF) generally decreases series resistance Rs and increases Q-factor of the acoustic resonator below the cutoff frequency of the main active region. A typical low velocity metal frame, for example, effectively provides a region with significantly lower cutoff frequency than the active region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at the active/frame interface, and are both mechanically and electrically excited at the top electrode edge. Where the width of the metal frame is properly designed for a given eigenmode, it results in resonantly enhanced suppression of that particular eigenmode. In addition, a sufficiently wide low velocity metal frame provides a region for smooth decay of the evanescent and complex modes, which are excited by similar mechanisms as the propagating eigenmodes. The combination of the above effects yields better energy confinement and higher Q-factor at a parallel resonance frequency Fp.

In addition to the functions performed by the metal frame(s) described above, they also perform other important functions relating to heat removal and structural stability. Disposing the metal frame(s) on the bottom surface of the bottom electrode lowers thermal impedance due to the thicker metal around the perimeter of the active region. The reduced thermal impedance improves heat flow away from the active region. In addition, the metal frame(s) improves structural stability at the interface between the metal and the substrate. In known acoustic resonator devices, the bottom surface of the bottom electrode around the perimeter of the swimming pool interfaces with the substrate. Excess heat and/or vibrations at this interface can cause these surfaces to separate or otherwise become damaged, which can result in performance issues. The inclusion of the metal frame(s) on the bottom surface of the bottom electrode reduces heat and vibrations at the interface between the bottom surface of the metal frame(s) and the substrate, thereby improving structural stability of the acoustic resonator device. Thus, while the metal frame(s) provide the same or similar performance benefits provided when metal frame(s) are disposed on the top electrode, they also provide important benefits in terms of heat dissipation and structural stability.

FIG. 1 is a top view of an acoustic resonator 100 according to a representative embodiment, and FIGS. 2, 3 and 5-14 are cross-sectional views of acoustic resonator 100, taken along a line A-A', according to different embodiments. The cross-sectional views correspond to different variations of acoustic resonator 100 and will be referred to, respectively, as acoustic resonators 100A-100L. Acoustic resonators 100A-100L have many of the same features, so a repetitive description of these features may be omitted in an effort to avoid redundancy.

Acoustic resonator 100 comprises a top electrode 103 having five (5) sides, with a connection side 101 configured to provide an electrical connection to interconnect 102. Interconnect 102 provides electrical signals to top electrode 103 to excite desired acoustic waves in a piezoelectric layer (not shown in FIG. 1) of acoustic resonator 100.

The five sides of top electrode 103 have different lengths, forming an apodized pentagon shape. In alternative embodiments, top electrode 103 may have a different number of sides. Although not shown in the drawings, other embodiments of acoustic resonators, such as those of FIGS. 2, 3 and 5-14, may have an appearance similar or identical to that of FIG. 1 when viewed from the top.

FIGS. 2, 3 and 5-14 are cross-sectional diagrams illustrating acoustic resonators, according to representative embodiments. In the examples depicted in FIGS. 2, 3 and 5-14, the acoustic resonator is an FBAR. Each of the acoustic resonators shown in FIGS. 2, 3 and 5-14 includes a cavity, also referred to as a swimming pool, formed in a substrate. It is understood that the same general configurations may be included in acoustic resonators having frames and/or air-rings in various locations, without departing from the scope of the present teachings.

Figure 2:
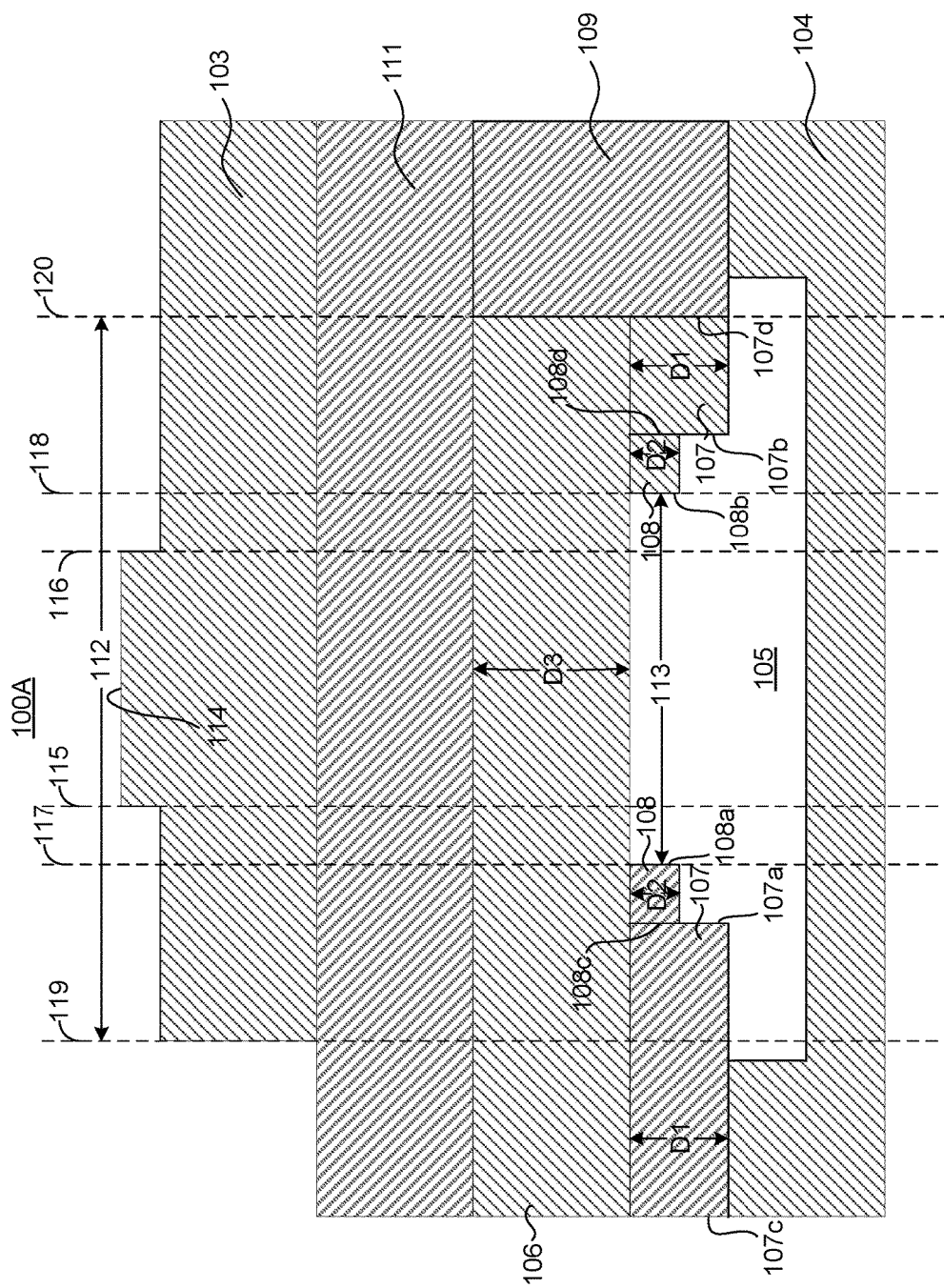
FIG. 2 is a cross-sectional view of an acoustic resonator according to a representative embodiment.

Referring to FIG. 2, acoustic resonator 100A (e.g., an FBAR) comprises a substrate 104 having an air cavity 105 formed therein, a bottom electrode 106, a first metal frame 107 disposed on the bottom surface of the bottom electrode 106 and in contact with the substrate 104, a second metal frame 108 disposed on the bottom surface of the bottom electrode 106, a planarization layer 109 disposed adjacent to bottom electrode 106 on the substrate 104, a piezoelectric layer 111 disposed on the bottom electrode 106 and on the planarization layer 109, and the top electrode 103 disposed on the piezoelectric layer 111. Collectively, bottom electrode 106, the piezoelectric layer 111, and the top electrode 103 constitute an acoustic stack of acoustic resonator 100A. Also, an overlap among the bottom electrode 106, the piezoelectric layer 111 and the top electrode 103 over the air cavity 105 defines a main membrane region 112 of the acoustic resonator 100A. The main membrane region 112 extends in the lateral directions between dashed lines 119 and 120. Although not shown, a passivation layer may be present on top of top electrode 103 (in each embodiment) with thickness sufficient to insulate all layers of the acoustic stack from the environment, including protection from moisture, corrosives, contaminants, debris and the like.

The first metal frame 107 has first and second inner edges 107a and 107b, respectively, on first and second sides, respectively, of the first metal frame 107. The first metal frame 107 has first and second outer edges 107c and 107d, respectively, on the first and second sides, respectively, of the first metal frame 107. The outer edge 107c on the first side of the first metal frame 107 may coincide with the outer edge of the bottom electrode 106. The outer edge 107d on the second side of the first metal frame 107 coincides with an inner edge of the planarization layer 109. The second metal frame 108 has first and second inner edges 108a and 108b, respectively, on first and second sides, respectively, of the second metal frame 108. The second metal frame 108 has first and second outer edges 108c and 108d, respectively, on the first and second sides, respectively, of the second metal frame 108. The outer edge 108c on the first side of the second metal frame 108 coincides with the inner edge 107a of the first metal frame 107. The outer edge 108d on the second side of the second metal frame 108 coincides with the inner edge 107b of the second side of the first meal frame 107. Notably, the first and second outer edges 108c and 108d, respectively, of the second metal frame 108 are provided for illustrative purposes only as a means to define the width of the second metal frame 108. As such, the width of the second frame 108 is defined as a distance between the first inner and outer edges 108a and 108c, respectively, on the non-connecting edges of the acoustic resonator 100A, and as the distance between the second inner and outer edges 108b and 108d, respectively, on the top electrode connecting edge of the acoustic resonator 100A. The central region 113 of the bottom electrode 106 is the portion of the bottom electrode 106 that is laterally inward of the inner edges 108a and 108b of the second metal frame 108.

The first metal frame 107 has a thickness equal to a first distance, D1, between the bottom surface of the bottom electrode 106 and the bottom surface of the first metal frame 107. The second metal frame 108 has a thickness equal to a second distance, D2, between the bottom surface of the bottom electrode 106 and the bottom surface of the second metal frame 108. The thickness of the first metal frame 107 is typically in the range of from about 10% to 70% of the thickness of the bottom electrode 106 in the central region 113 of the bottom electrode 106. Preferably, the thickness of the first metal frame 107 ranges from about 35% to 65% of the thickness of the bottom electrode 106 in the central region 113 of the bottom electrode 106. The thickness of the bottom electrode 106 in the central region 113 is equal to a third distance D3 between the top and bottom surfaces of the bottom electrode 106. The thickness of the second metal frame 108 is in the range of from about 10% to 70% of the thickness of the bottom electrode 106 in a central region 113 of the bottom electrode 106 and is typically about half the thickness of the first metal frame 107.

The top electrode 103 has an add-on metal layer 114 formed on its top surface that thickens the portion of the top electrode 103 that is in between the dashed lines 115 and 116. Thickening this portion of the top electrode 103 and forming the first and second metal frames 107 and 108, respectively, on the bottom surface of the bottom electrode 106 results in the stack being thinnest in locations in between dashed lines 115 and 117 and in between dashed lines 116 and 118. The result is that these areas of the stack are high velocity regions that have the highest resonance frequency of all of the regions of the stack. This improves performance of the device 100A for frequencies that are below the series resonance frequency of the device 100A.

The substrate 104 may be formed of a material compatible with semiconductor processes, such as silicon (Si), gallium arsenide (GaAs), indium phosphide (InP), glass, sapphire, alumina, or the like, for example. The cavity 105 may be formed by etching a cavity in the substrate 104 and filling the etched cavity with a sacrificial material, such as phosphosilicate glass (PSG), for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 106 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 106 may be formed of two or more layers of electrically conductive materials, which may by the same as or different from one another. Likewise, the top electrode 103 may be formed of electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the top electrode 103 may be formed of two or more layers of electrically conductive materials, which may by the same as or different from one another. Also, the configuration and/or the material(s) forming the top electrode 103 may be the same as or different from the configuration and/or the material(s) forming the bottom electrode 103.

The piezoelectric layer 111 may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator 100A (as well as the other acoustic resonator described herein) without departing from the scope of the present teachings. Also, in various embodiments, piezoelectric layer 111 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 111. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al., and U.S. patent application Ser. No. 13/662,460 (filed Oct. 27, 2012), to Grannen et al., which are hereby incorporated by reference in their entireties. Of course, doping piezoelectric layers with one or more rare earth elements may be applied to any of various embodiments, including the embodiments described below with reference to FIGS. 2, 3 and 5-14.

The first and second metal frames 107 and 108, respectively, may be formed of one or more conductive materials, such as copper (Cu), molybdenum (Mo), aluminum (Al), tungsten (W), for example. The planarization layer 109 may be formed of borosilicate glass (BSG), for example. The planarization layer 109 is not strictly required for the functioning of acoustic resonator 100A, but its presence can confer various benefits. For instance, the presence of the planarization layer 109 tends to improve the structural stability of acoustic resonator 100A, may improve the quality of growth of subsequent layers, and may allow bottom electrode 106 to be formed without its edges extending beyond the cavity 105. Further examples of potential benefits of planarization are presented in U.S. Patent Application Publication No. 2013/0106534 (published May 2, 2013) to Burak et al., which is hereby incorporated by reference in its entirety.

During illustrative operation of the acoustic resonator 100A (e.g., as a part of a ladder filter), an input electrical signal is applied to an input terminal of bottom electrode 106 and top electrode 103 is connected to the output terminal. The input electrical signal typically comprises a time-varying voltage that causes vibration in the main membrane region 112. This vibration in turn produces an output electrical signal at an output terminal of top electrode 103. The input and output terminals may be connected to bottom and top electrodes 106 and 103 via connection edges that extend away from the main membrane region 112 as shown in FIG. 2. The input and output terminals of acoustic resonator 100A may be connected to appropriate terminals of other acoustic resonators forming the ladder filter, for instance.

Figure 3:
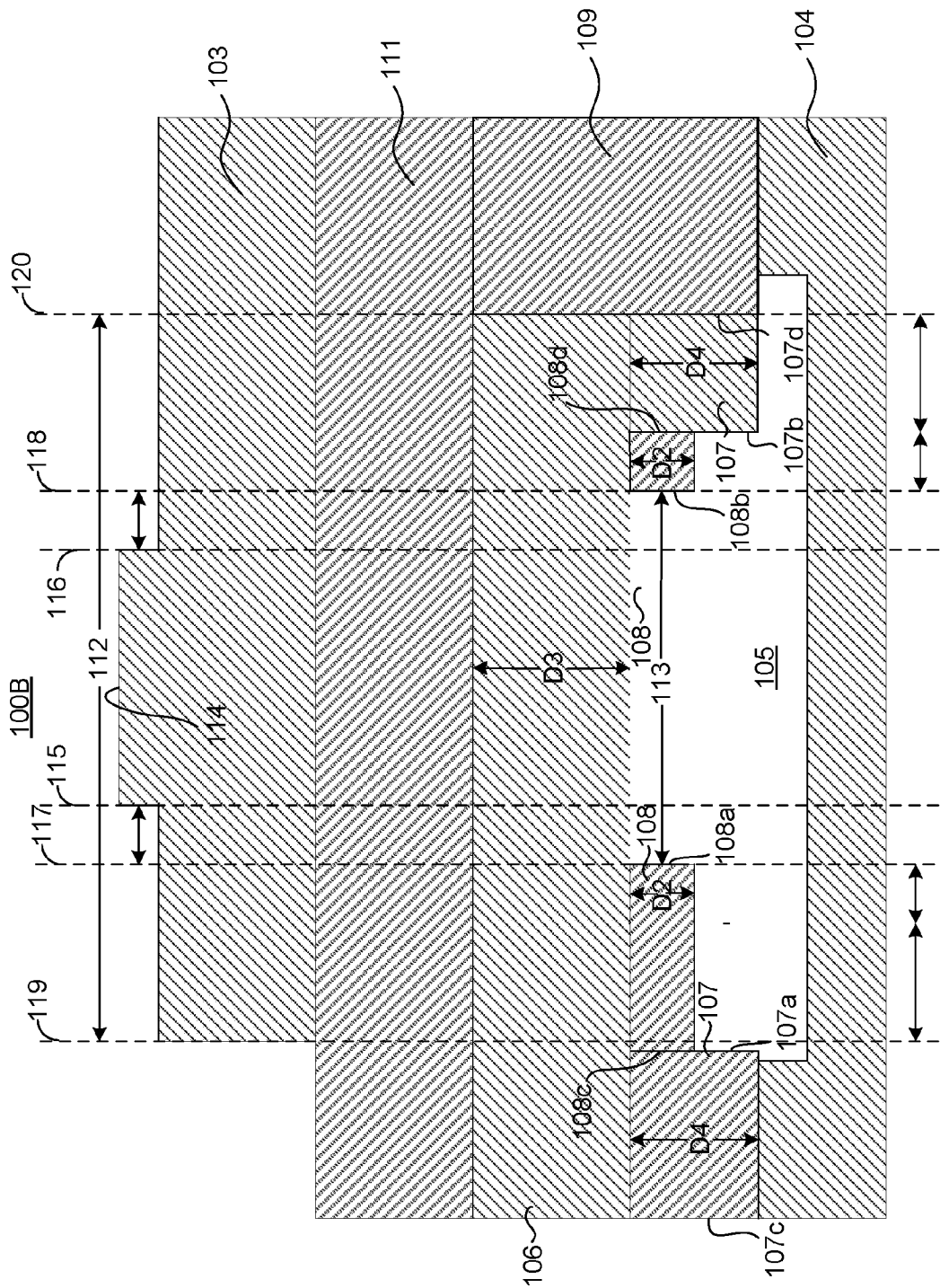
FIG. 3 is a cross-sectional view of an acoustic resonator according to a representative embodiment.

Referring to FIG. 3, acoustic resonator 100B (e.g., an FBAR) is identical to the acoustic resonator device 100A except that the inner edge 107a of the first metal frame 107 does not extend underneath the top electrode 103. In other words, the first side of the first metal frame 107 is outside of the active region of the acoustic resonator 100B. This allows the first metal frame 107 to have an arbitrary thickness equal to a distance D4 because it will have no effect on operation of the acoustic resonator 100B, such a acoustic scattering of the piston mode excited in main membrane region 112 at the edges of the top electrode 103. In addition, the metallic material of which the first metal frame 107 is made can be any metal that is compatible with the acoustic resonator fabrication process, which allows more flexibility in choosing metallic materials that have high thermal conductivities. The additional metal thickness D4 further improves heat dissipation and increases structural stability at the perimeter of the acoustic resonator 100B. Because the second side of the first metal frame 107 does extend underneath the top electrode 103, and therefore is in the active region, the increased thickness of the first metal frame 107 can increase acoustic scattering on the top electrode connecting edge of the acoustic resonator 100B. The increased acoustic scattering can be ameliorated in other ways, such as by including air rings or air bridges in the resonator 100B, as will be described below in more detail. Also, the portion of the first metal frame 107 on the second side, i.e., on the top electrode connecting edge, can be replaced with a sacrificial material used to fill in the air-cavity 105. After the membrane release process step, only the second metal frame 108 remains on the top electrode connecting edge, extending to the edge of the bottom electrode 106 indicated by the vertical line 120.

With respect to known acoustic resonator devices, a choke point for the transfer of heat out of the devices generally exists at the perimeter of the main membrane region along a thermal path from the piezoelectric layer, through the bottom electrode and into the substrate. Forming one or more metal frames 107 and/or 108 on the bottom surface of the bottom electrode 106 reduces the thermal impedance of the acoustic resonator at the choke point, thereby improving the transfer of heat out of the piezoelectric layer 111. Improving heat transfer in this manner improves performance and is especially important in high power applications. In addition, the thickness of the first metal frame 107 improves mechanical stability of the acoustic resonator to prevent possible delamination from occurring at the interface between the lower surface of the first metal frame 107 and the substrate 104.

Figure 4:
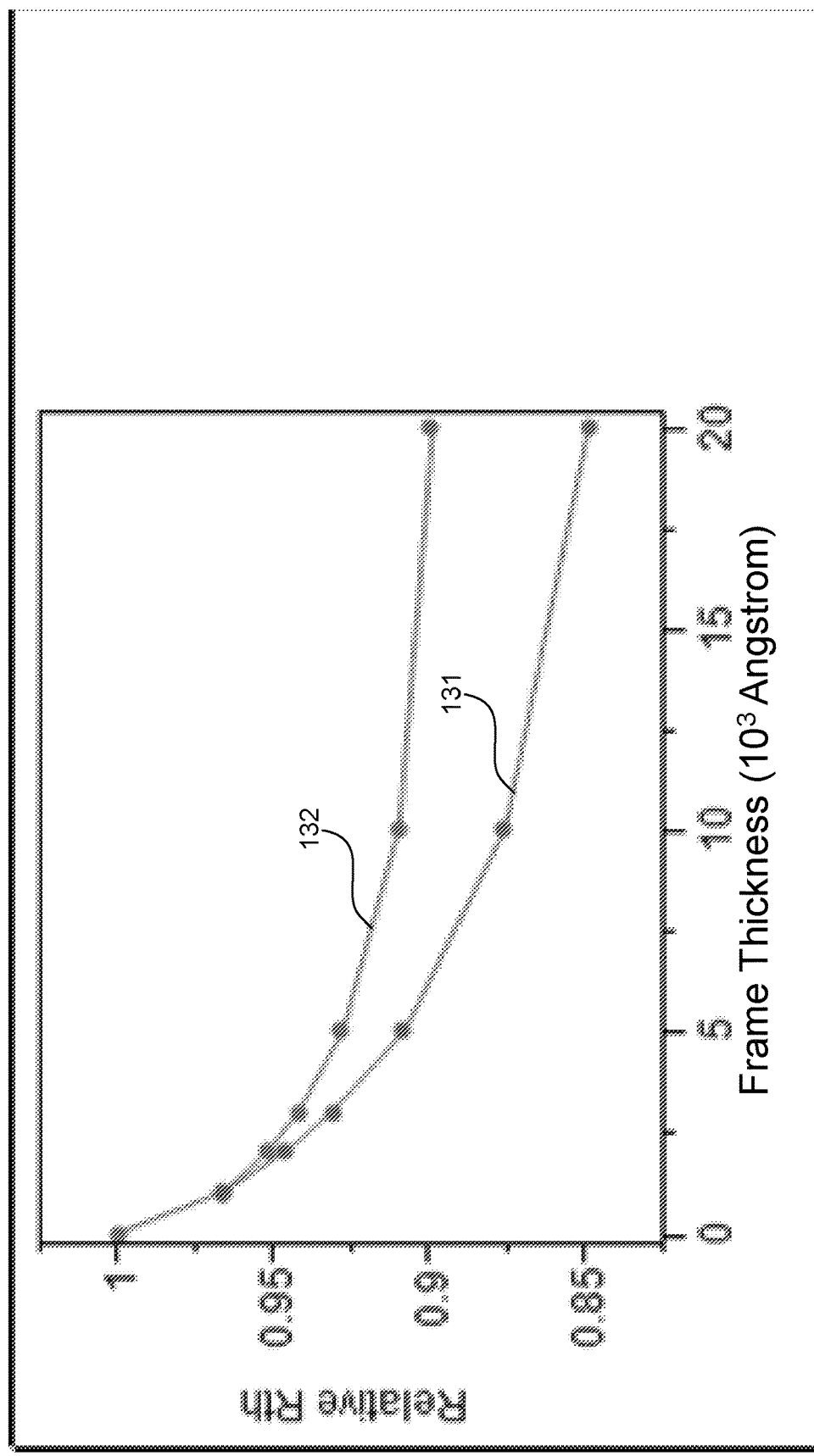
FIG. 4 illustrates first and second plots of thermal impedance normalized to the thermal impedance of a standard FBAR device as a function of changes in the thickness of a first metal frame formed on a bottom surface of a bottom electrode of the acoustic resonator shown in FIG. 2.

FIG. 4 illustrates first and second plots 131 and 132, respectively, of thermal impedance, $R_{TH}$, normalized to the thermal impedance of a standard FBAR device (i.e., a FBAR device that does not include the first and second metal frames 107) as a function of changes in the thickness of the first metal frame 107. The first plot 131 corresponds to the acoustic resonator device 100A shown in FIG. 2 in which the first side of the first metal frame 107 overlaps the main membrane region 112 by 2 micrometers. The second plot 132 corresponds to the acoustic resonator device 100B shown in FIG. 3 in which the first side of the first metal frame 107 does not extend into the main membrane region 112. The width of the second metal frame 108 was kept constant at 3 micrometers and its thickness was kept constant at 1,000 Angstrom. The thickness of the first metal frame 107 was varied from 1,000 Angstrom to 2 micrometers. The plots 131 and 132 demonstrate an improvement in thermal impedance of up to 15% and 10%, respectively, due to the improved thermal paths provided by the first metal frame 107. Notably, the same metal (Molybdenum) has been used in simulations for the bottom electrode 106, the first metal frame 107 and the second frame 108. In alternative embodiments, the first metal frame 107 may be formed of metals with better thermal conductivity than the metal used to form the bottom electrode 106, such as silver (Ag), gold (Au) or copper (Cu), to further increase the expected improvements in thermal impedance. In general, such high thermal conductivity materials may not be preferable for forming the electrodes of the acoustic resonators 100A through 100L due to their poor acoustic properties, such as high viscous loss and low acoustic impedance, for example.

Generally, frames, air-wings, and air-bridges can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or effective electromechanical coupling coefficient $Kt^2$.

Figure 5:
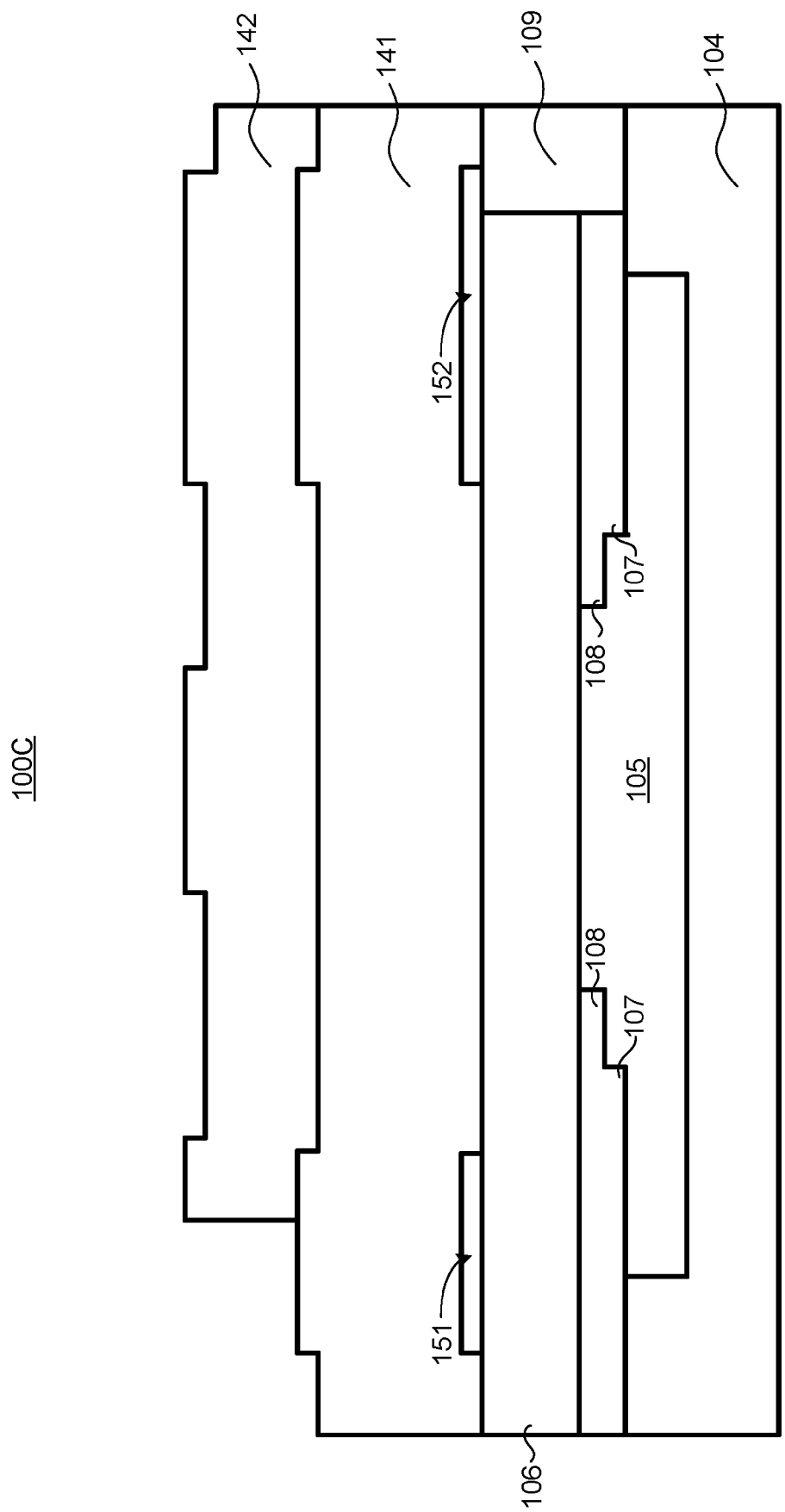
FIG. 5 is a cross-sectional view of an acoustic resonator according to a representative embodiment.

Referring to FIG. 5, acoustic resonator 100C (e.g., an FBAR) is similar to acoustic resonator device 100A shown in FIG. 2 except for differences between the piezoelectric layer 141 and the top electrode 142 shown in FIG. 5 and the piezoelectric layer 111 and the top electrode 103 shown in FIG. 2, respectively. Like the acoustic resonator 100A shown in FIG. 2, the acoustic resonator 100C shown in FIG. 5 comprises a substrate 104 having an air cavity 105 formed therein, a bottom electrode 106, a first metal frame 107 disposed on the bottom surface of the bottom electrode 106 and in contact with the substrate 104, a second metal frame 108 disposed on the bottom surface of the bottom electrode 106, and a planarization layer 109 disposed adjacent to bottom electrode 106 on the substrate 104. In accordance with this embodiment, first and second air-bridges 151 and 152, respectively, which together form an air ring, are formed between the top surface of the bottom electrode 106 and the bottom surface of the piezoelectric layer 141. The air ring eliminates the parasitic transducer effect at the top electrode connecting edge in a region where the top electrode 142, the piezoelectric layer 141 and the bottom electrode 106 would overlap with the substrate 104 without the presence of an air ring, and therefore improves the electrical performance of the acoustic resonator 100C.

Figure 6:
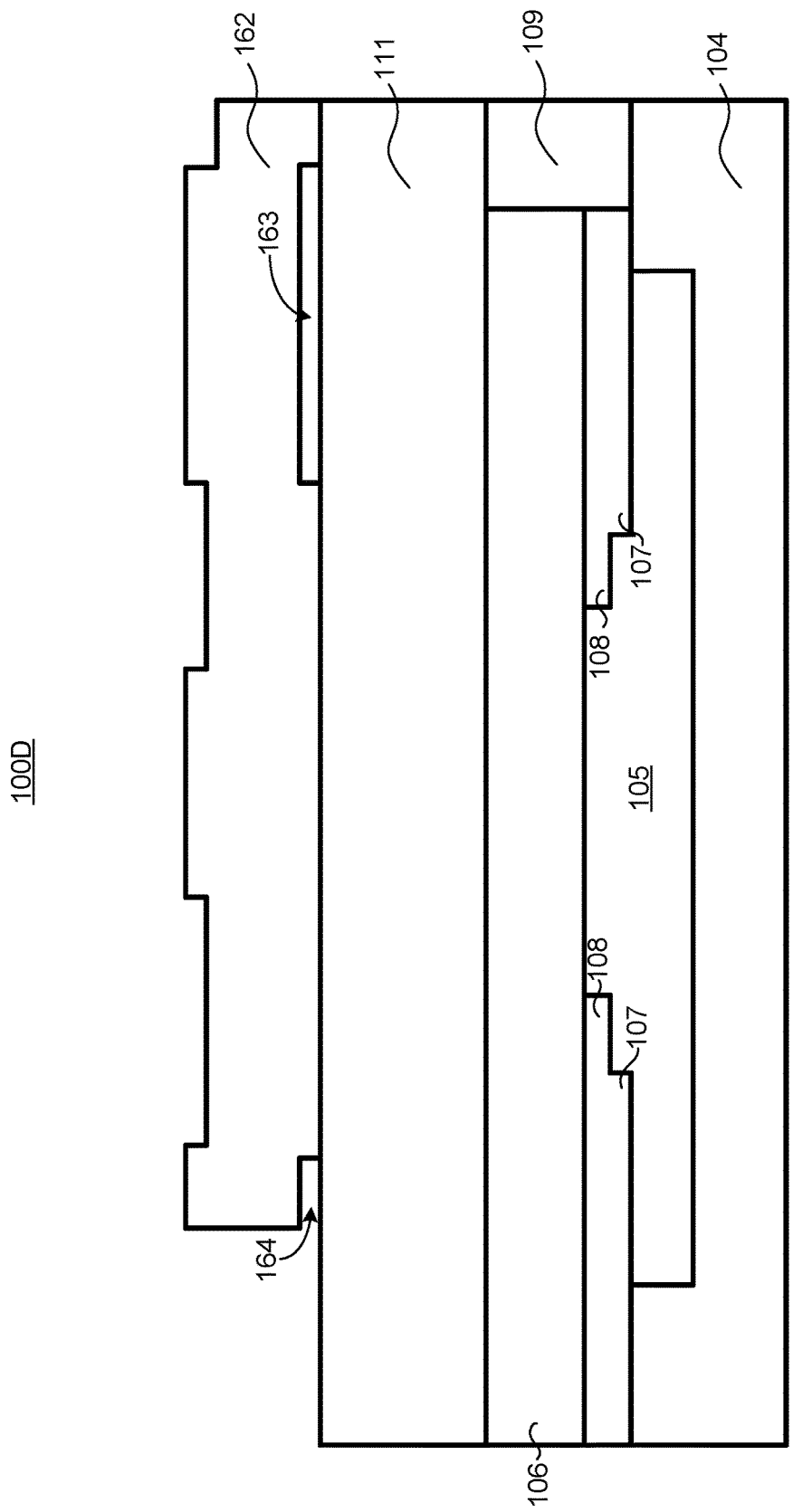
FIG. 6 is a cross-sectional view of an acoustic resonator according to a representative embodiment.

Referring to FIG. 6, acoustic resonator 100D (e.g., an FBAR) is similar to acoustic resonator device 100A shown in FIG. 2 except for a few differences between the top electrode 162 shown in FIG. 6 and the top electrode 103 shown in FIG. 2. Like the acoustic resonator 100A shown in FIG. 2, the acoustic resonator 100D shown in FIG. 6 comprises a substrate 104 having an air cavity 105 formed therein, a bottom electrode 106, a first metal frame 107 disposed on the bottom surface of the bottom electrode 106 and in contact with the substrate 104, a second metal frame 108 disposed on the bottom surface of the bottom electrode 106, a planarization layer 109 disposed adjacent to bottom electrode 106 on the substrate 104, and a piezoelectric layer 111 disposed in between the top electrode 162 and the bottom electrode 106. In accordance with this embodiment, an air-bridge 163 and an air-wing 164, which together form an air-ring, are formed between the bottom surface of the top electrode 162 and the top surface of the piezoelectric layer 111. The air-ring eliminates the parasitic transducer effect and improves the electrical performance of acoustic resonator 100D.

Figure 7:
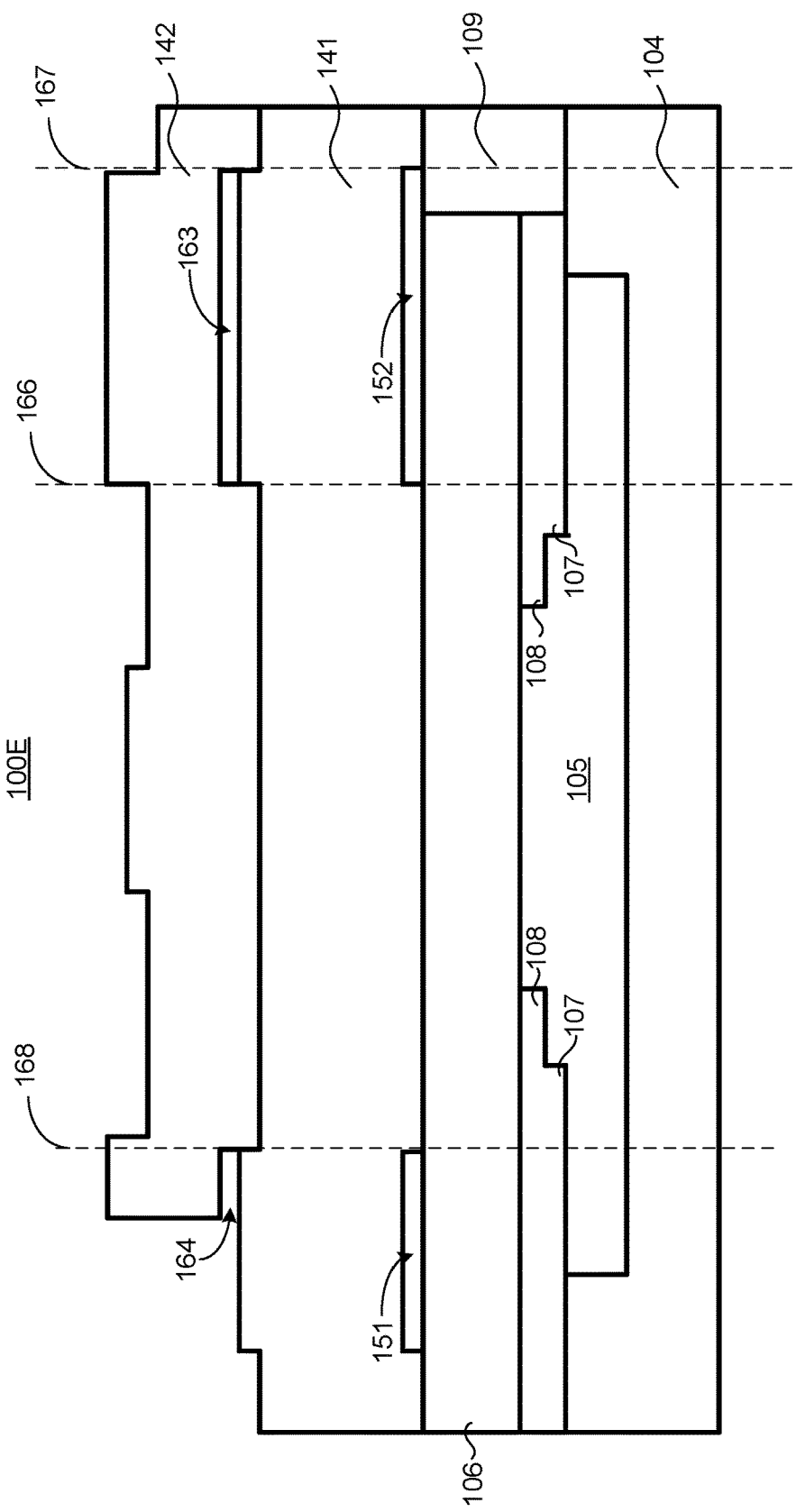
FIG. 7 is a cross-sectional view of an acoustic resonator according to a representative embodiment.

Referring to FIG. 7, acoustic resonator 100E (e.g., an FBAR) is similar to the acoustic resonators 100C and 100D shown in FIGS. 5 and 6, respectively. The acoustic resonator 100E includes the air-ring comprising the combined air-bridge 163 and an air-wing 164 shown in FIG. 6 and the air-ring comprising the air-bridges 151 and 152 shown in FIG. 5. The air-bridges 152 and 163 are aligned with one another, as indicated by the dashed lines 166 and 167. Likewise, the air-wing 164 and the air-bridge 151 are aligned with one another, as indicated by the dashed line 168. Thus, the acoustic resonator 100E has two aligned air-rings that eliminate the parasitic transducer effect and improve the electrical performance of the acoustic resonator 100E.

Figure 8:
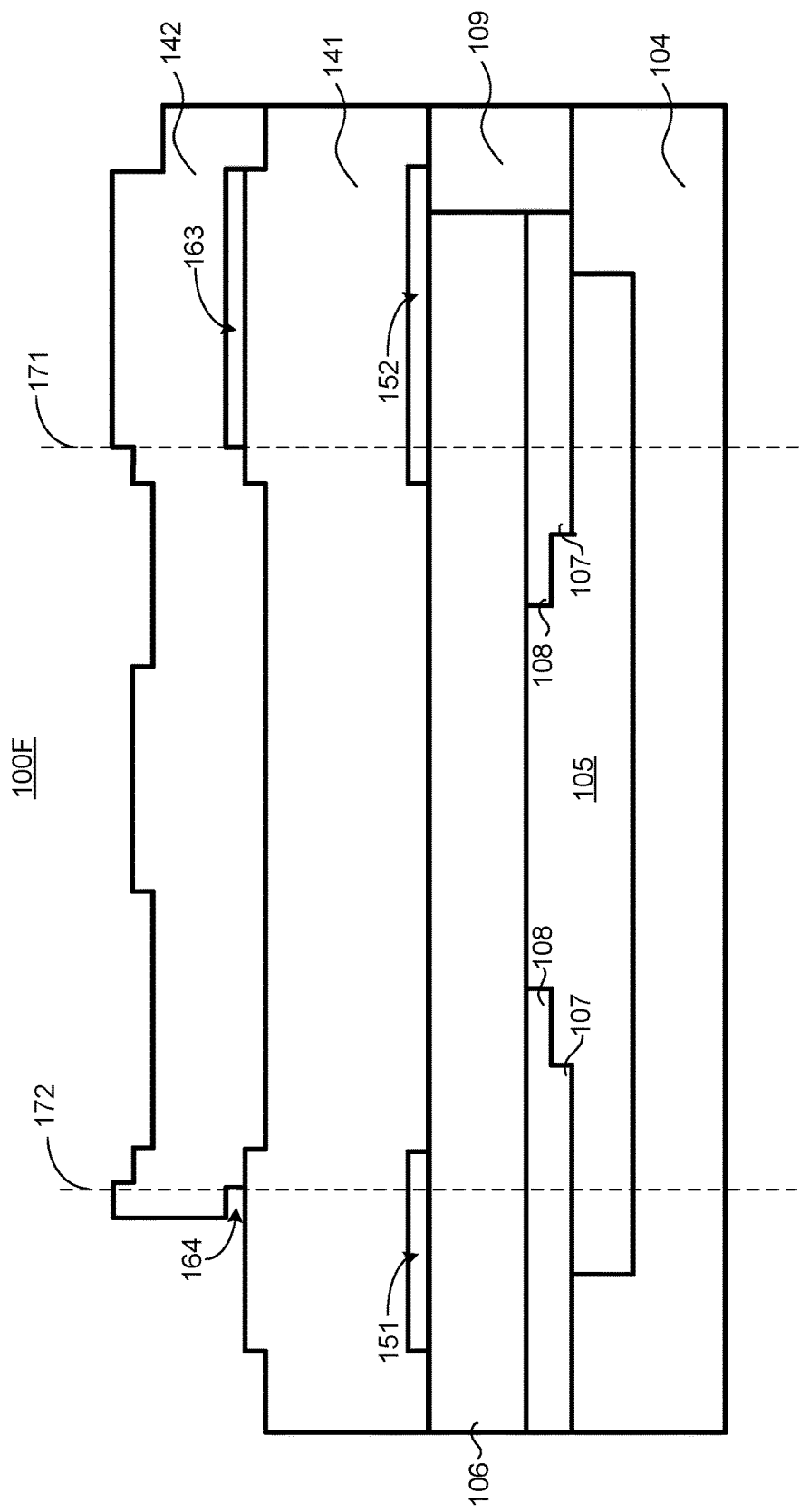
FIG. 8 is a cross-sectional view of an acoustic resonator according to a representative embodiment.

Referring to FIG. 8, acoustic resonator 100F (e.g., an FBAR) is similar to the acoustic resonator 100E shown in FIG. 7 except that the air-bridges 152 and 163 are misaligned with one another and the air-wing 164 and the air-bridge 151 are misaligned with one another, as indicated by the dashed lines 171 and 172, respectively. Thus, the acoustic resonator 100F has two misaligned air-rings. The misaligned air-rings eliminate the parasitic transducer effect and improve the electrical performance of the acoustic resonator 100F.

Figure 9:
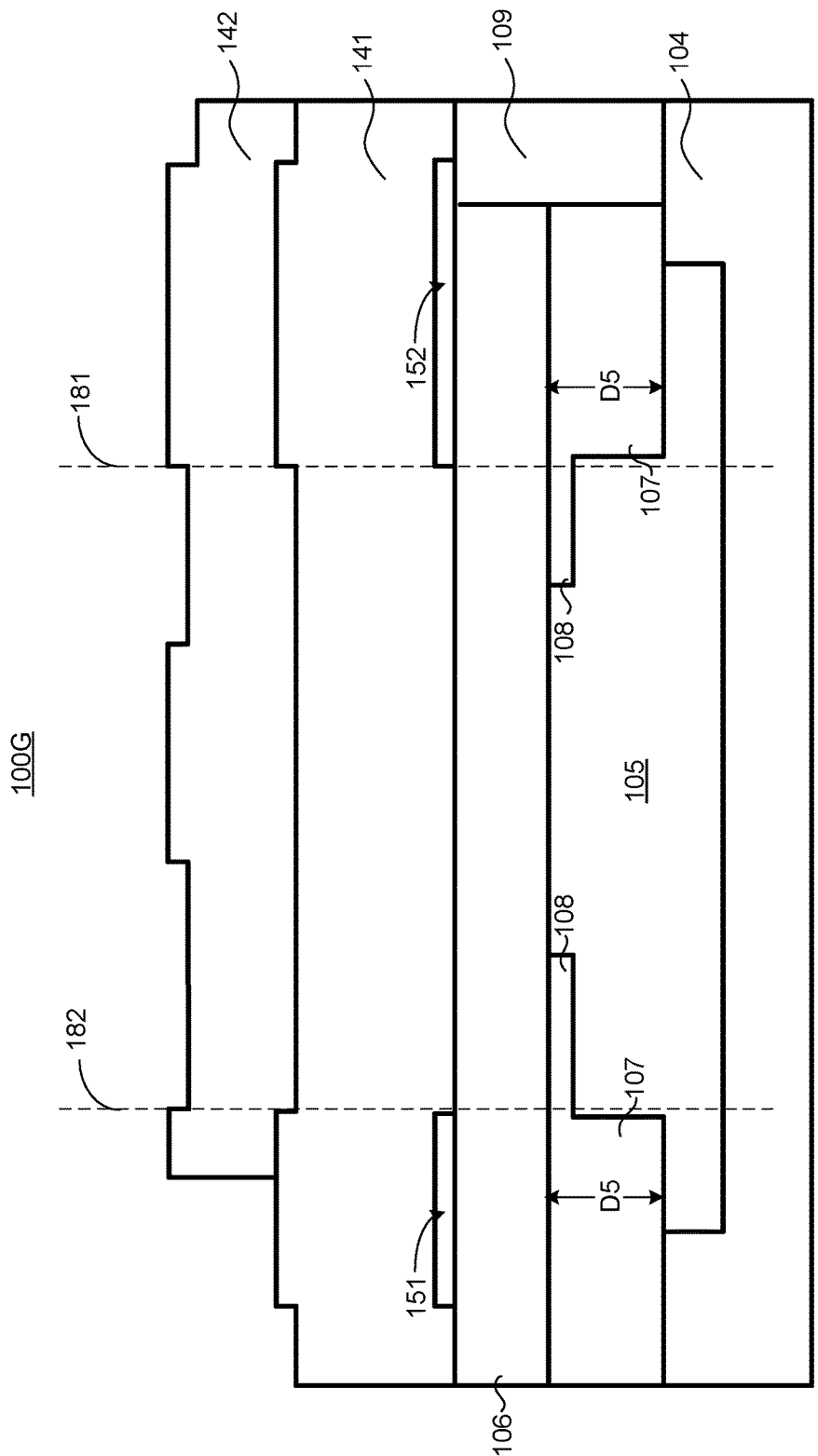
FIG. 9 is a cross-sectional view of an acoustic resonator according to a representative embodiment.

Referring to FIG. 9, acoustic resonator 100G is similar to the acoustic resonator 100C shown in FIG. 5 in that it includes the air-ring comprising air-bridges 151 and 152 and the other features shown in FIG. 5 except that the first metal frame 107 has an increased thickness equal to a distance D5 between the bottom surface of the bottom electrode 106 and the bottom surface of the first metal frame 107. Like the acoustic resonator 100C shown in FIG. 5, the acoustic resonator 100G shown in FIG. 9 comprises a substrate 104 having an air cavity 105 formed therein, a bottom electrode 106, the first and second metal frames 107 and 108, respectively, a planarization layer 109 disposed adjacent to bottom electrode 106 on the substrate 104, a piezoelectric layer 141 and a top electrode 142. The air-ring eliminates the parasitic transducer effect and improves electrical performance while the increased thickness of the first metal frame 107 improves structural stability and thermal impedance. Because the first metal frame 107 is terminated underneath the air-ring, as indicated by the locations of the dashed lines 181 and 182 relative to these features, the first metal frame 107 can have an increased thickness for improved mechanical stability and heat transfer without having any effect on acoustic loss due to scattering of the electrically excited piston mode at the edge of the top electrode 142.

Figure 10:
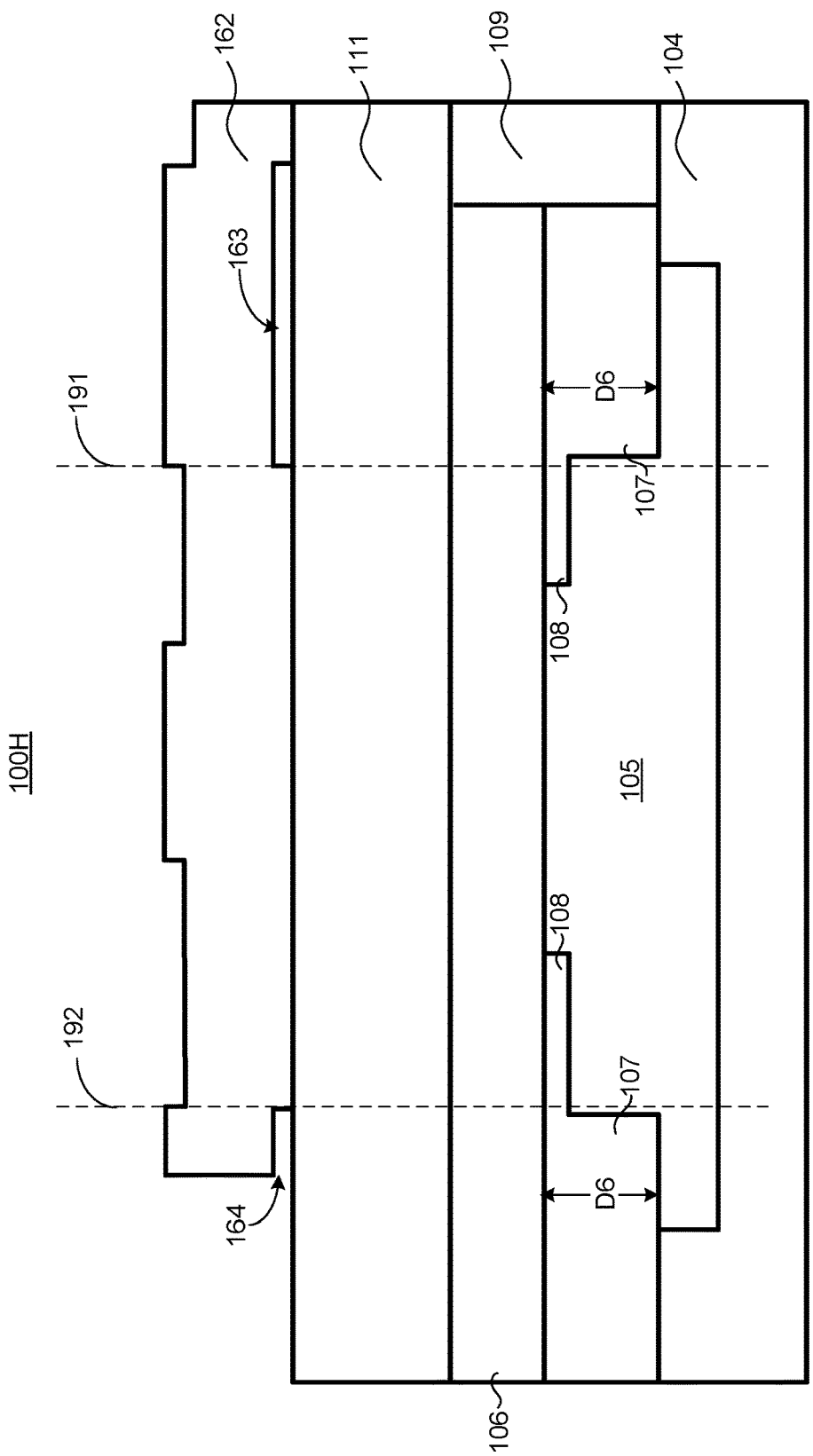
FIG. 10 is a cross-sectional view of an acoustic resonator according to a representative embodiment.

Referring to FIG. 10, acoustic resonator 100H is similar to the acoustic resonator 100D shown in FIG. 6 in that it includes the air-ring comprising air-bridge 163 and air-wing 164 and the other features shown in FIG. 6 except that the first metal frame 107 has an increased thickness equal to the distance D6 between the bottom surface of the bottom electrode 106 and the bottom surface of the first metal frame 107. Like the acoustic resonator 100D shown in FIG. 6, the acoustic resonator 100H shown in FIG. 10 comprises a substrate 104 having an air cavity 105 formed therein, a bottom electrode 106, first and second metal frames 107 and 108, respectively, a planarization layer 109 disposed adjacent to bottom electrode 106 on the substrate 104, a piezoelectric layer 111, and a top electrode 162. The air-ring eliminates the parasitic transducer effect and improves electrical performance while the increased thickness of the first metal frame 107 improves structural stability and reduces thermal impedance. Because the first metal frame 107 is terminated underneath the air-ring, as indicated by the locations of dashed lines 191 and 192 relative to these features, the first metal frame 107 can have an increased thickness for improved mechanical stability and heat transfer without having any effect on acoustic loss due to scattering of the electrically excited piston mode at the edge of the top electrode 162.

Figure 11:
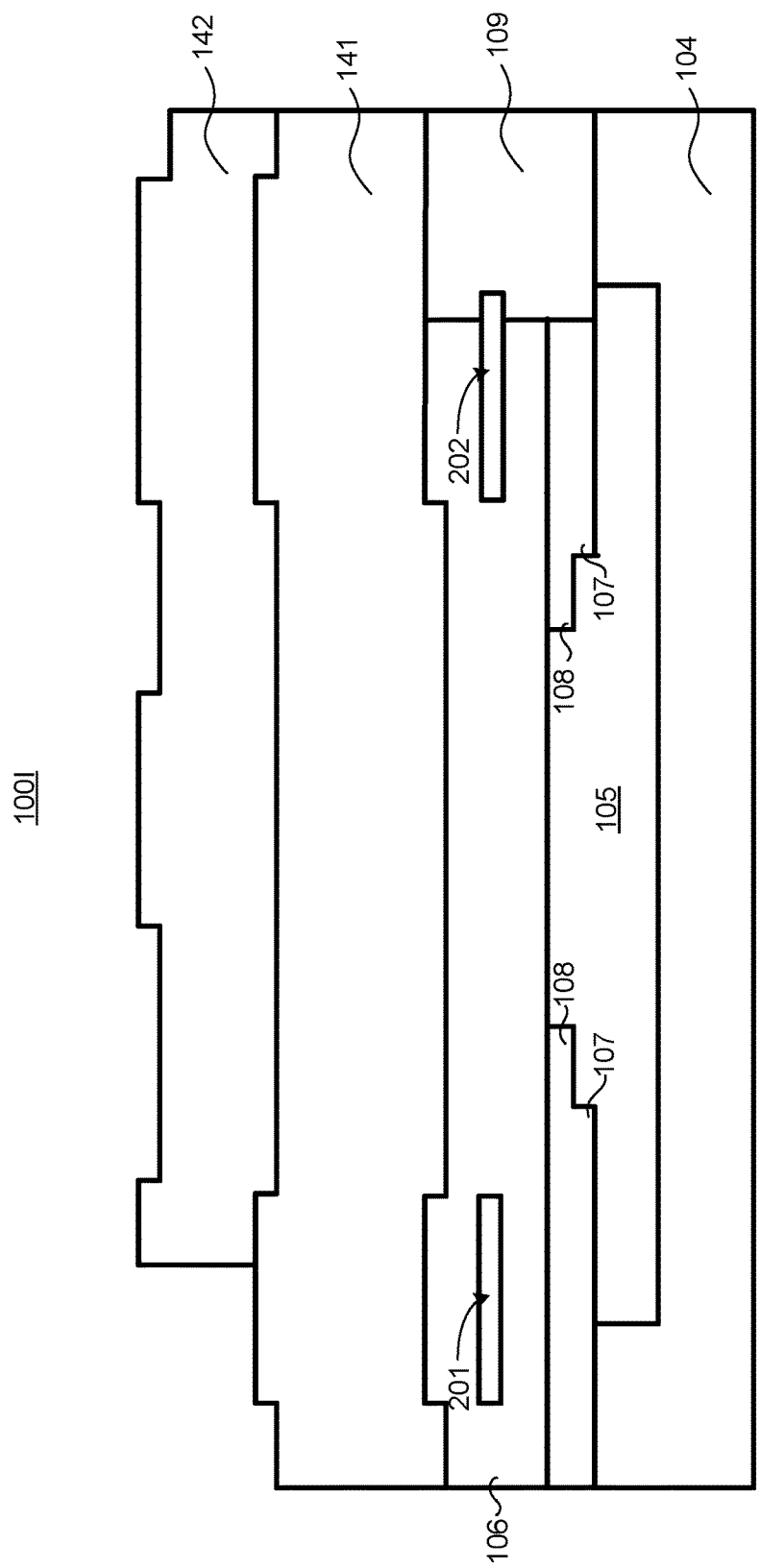
FIG. 11 is a cross-sectional view of an acoustic resonator according to a representative embodiment.

Referring to FIG. 11, acoustic resonator 100I is similar to the acoustic resonator 100C shown in FIG. 5 except that the air-ring of the acoustic resonator 100I is formed in the bottom electrode 106 rather than in between the piezoelectric layer 141 and the bottom electrode 106, as in acoustic resonator 100C. The air ring comprises air-bridges 201 and 202 formed in the bottom electrode 106. As with the other embodiments, the air-ring eliminates the parasitic transducer effect and improves electrical performance of acoustic resonator 100I. Forming the air ring in the bottom electrode 106 rather than in between the bottom electrode 106 and the piezoelectric layer 141 helps ensure that the piezoelectric layer 141 is of the highest quality by avoiding the need to deposit the piezoelectric layer 141 over the sacrificial material needed to form the air-ring.

Figure 12:
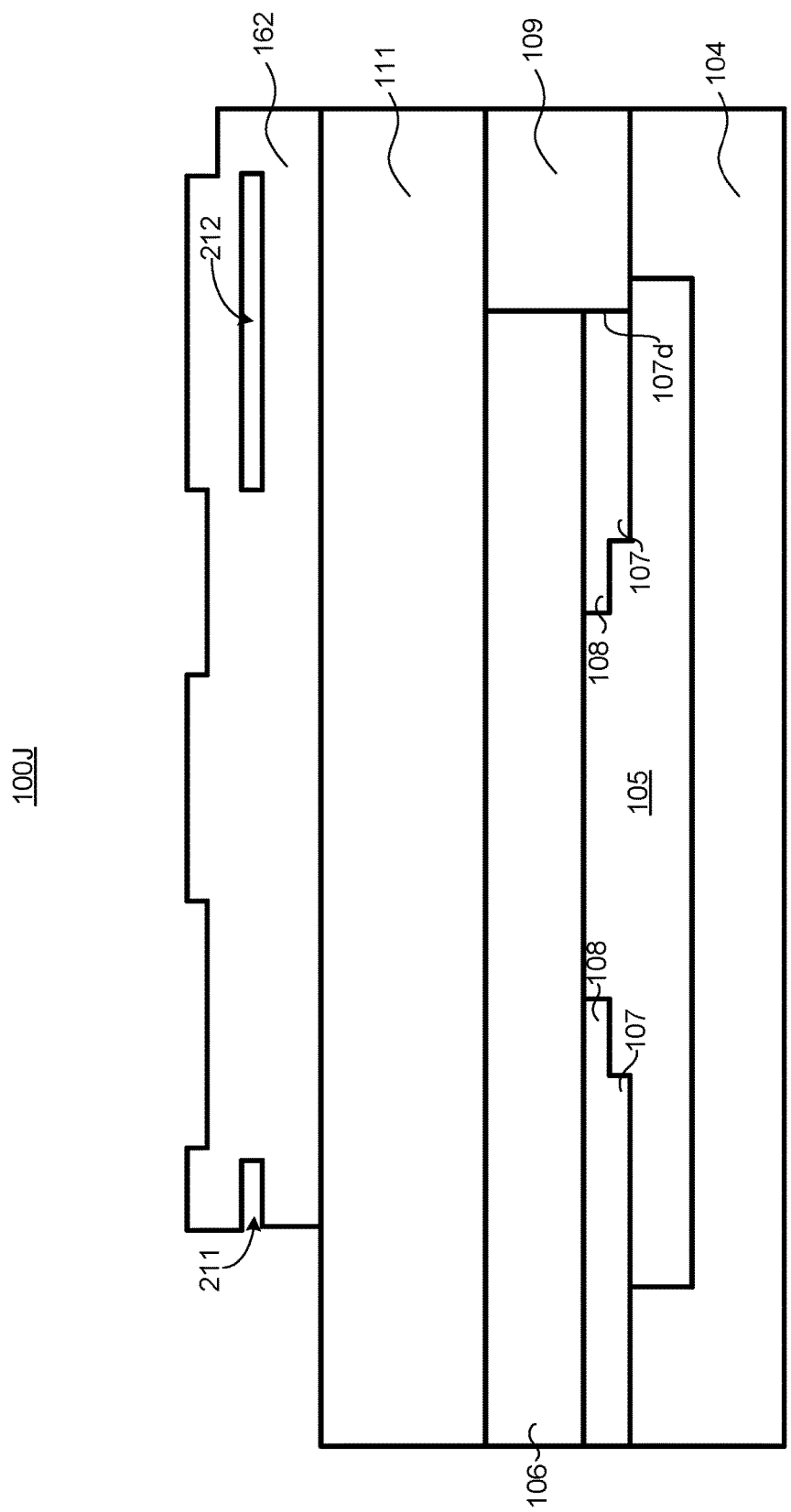
FIG. 12 is a cross-sectional view of an acoustic resonator according to a representative embodiment.

Referring to FIG. 12, acoustic resonator 100J is similar to the acoustic resonator 100D shown in FIG. 6 except that the air-ring of the acoustic resonator 100J is formed in the top electrode 162 rather than in between the piezoelectric layer 111 and the top electrode 162, as in acoustic resonator 100D. The air ring comprises air-wing 211 and air-bridge 212 formed in the top electrode 162. In order to avoid the parasitic transducer effect, the outer edge 107d on the second side of the first metal frame 107 has been terminated inside the air cavity 105 on the connecting side of the top electrode 103. The air-ring may improve the electrical performance of acoustic resonator 100J by not exposing the piezoelectric layer 111 to possibly harmful chemical interactions with the sacrificial layer used to form an air-ring.

Figure 13:
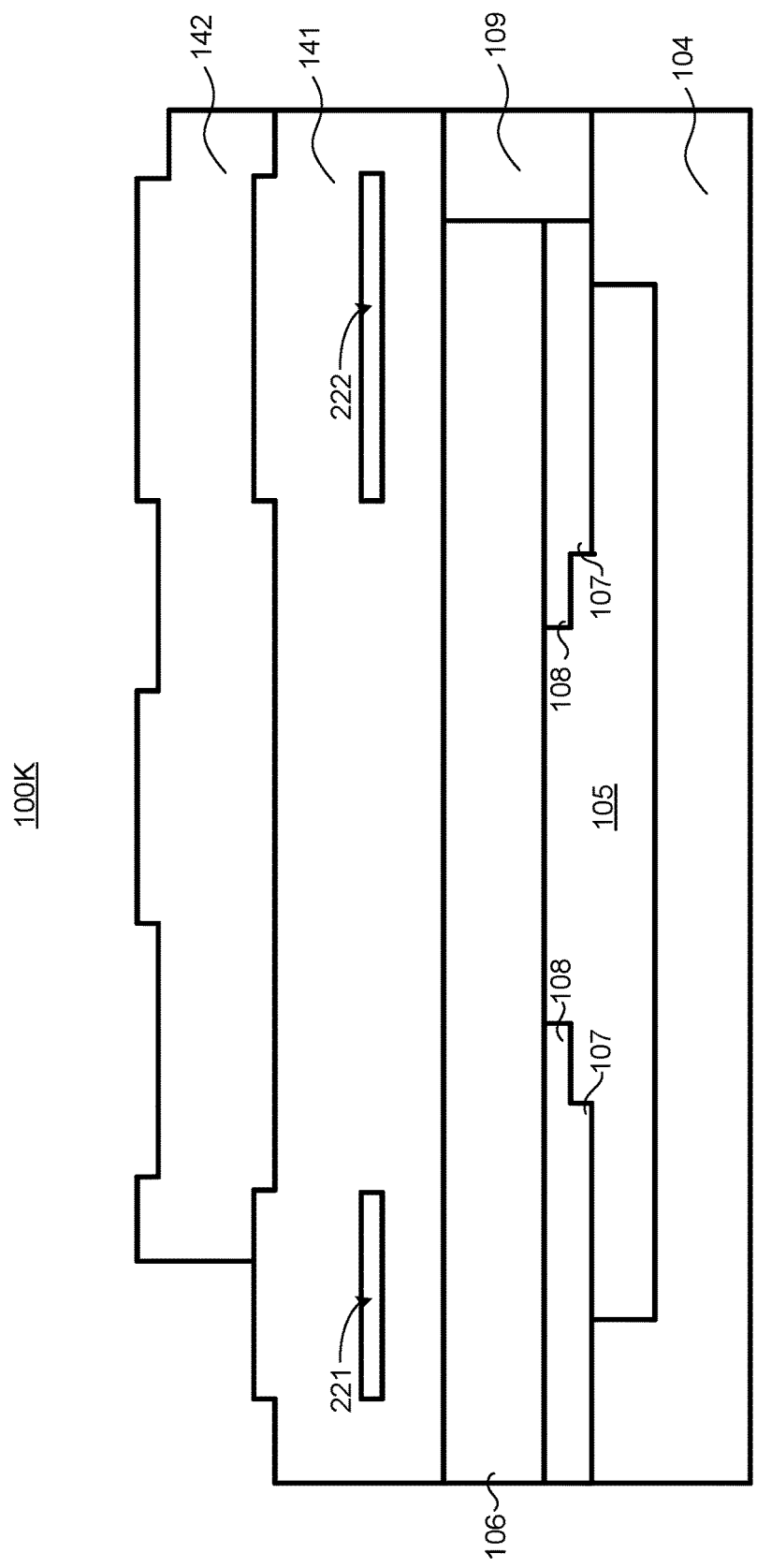
FIG. 13 is a cross-sectional view of an acoustic resonator according to a representative embodiment.

Referring to FIG. 13, acoustic resonator 100K is similar to the acoustic resonator 100C shown in FIG. 5 except that the air-ring of the acoustic resonator 100K is within the piezoelectric layer 141 rather than in between the piezoelectric layer 141 and the bottom electrode 106, as in acoustic resonator 100C. The air ring comprises air-bridges 221 and 222 formed in the piezoelectric layer 141. As with the other embodiments, the air-ring eliminates the parasitic transducer effect and improves the electrical performance of acoustic resonator 100K. Forming the air ring in the piezoelectric layer 141 rather than in between the bottom electrode 106 and the piezoelectric layer 141 can present difficulties in terms of forming a piezoelectric layer that has very high quality. However, if these difficulties can be overcome, forming the air ring in the piezoelectric layer 141 can have the strongest effect on performance.

Figure 14:
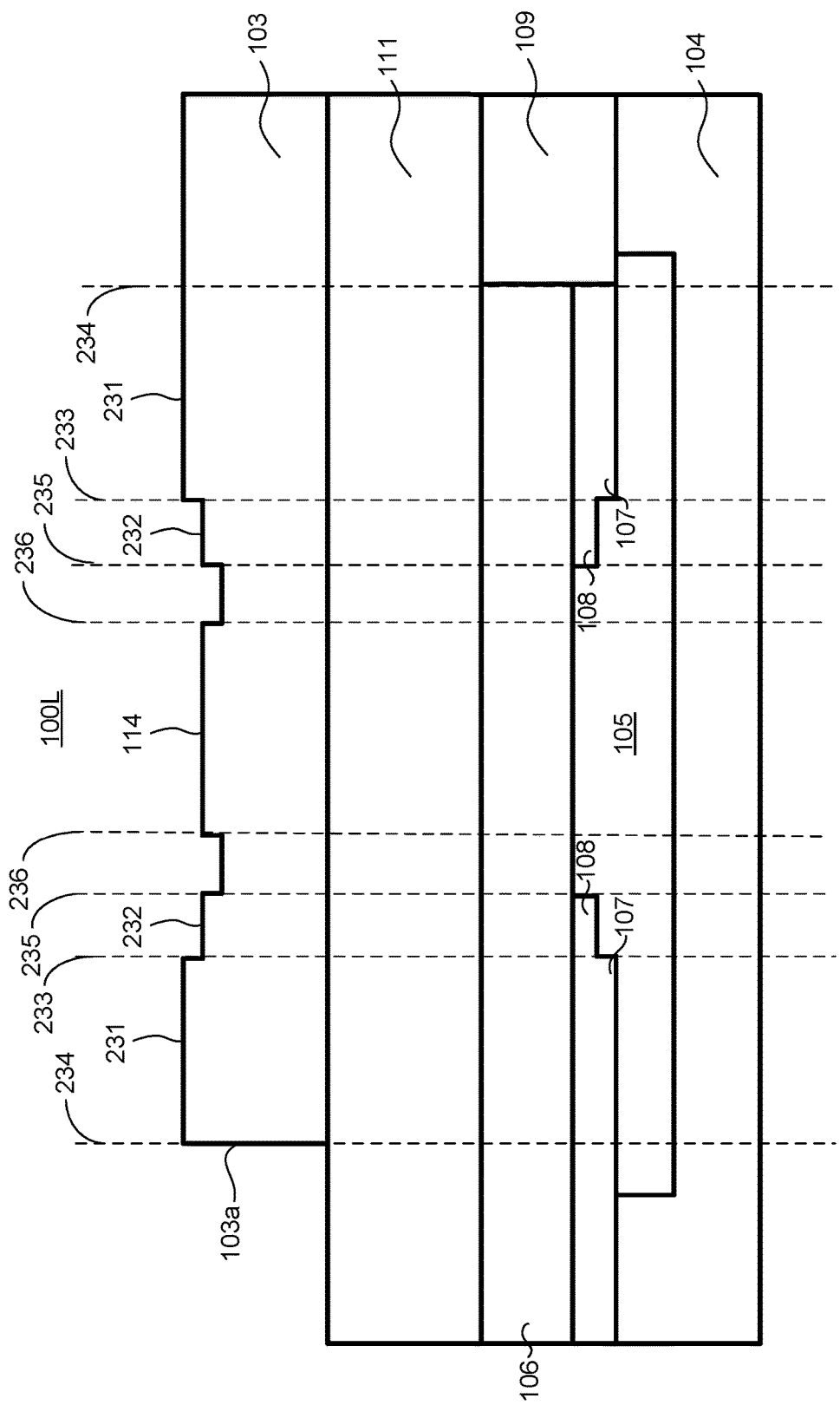
FIG. 14 is a cross-sectional view of an acoustic resonator according to a representative embodiment.

Referring to FIG. 14, acoustic resonator 100L is similar to the acoustic resonator 100A shown in FIG. 2 except that additional metal frames have been formed on the top surface of the top electrode 103. Like the acoustic resonator 100A shown in FIG. 2, the acoustic resonator 100L shown in FIG. 14 comprises a substrate 104 having an air cavity 105 formed therein, a bottom electrode 106, first and second metal frames 107 and 108, respectively, a planarization layer 109, a piezoelectric layer 111, and a top electrode 103. The top electrode 103 has a third metal frame 231 and a fourth metal frame 232 formed on the top surface thereof. As indicated by the dashed lines 233 and 234, the first and third metal frames 107 and 231, respectively, are aligned with one another. As indicated by the dashed lines 233 and 235, the second and fourth metal frames 108 and 232, respectively, are aligned with one another.

In general, the discontinuity at the non-connecting edge 103a of the top electrode 103 has the predominant impact on mechanically exciting eigenmodes. As should be appreciated by one skilled in the art, various eigenmodes supported by the multilayered stack comprising the bottom electrode 106, the piezoelectric layer 111 and the top electrode 103 may have acoustic energy confined either to the bottom part of the stack, to the middle part of the stack or to the top part of the stack. Therefore, the first and the second metal frames 107 and 108, respectively, interact predominantly with the eigenmodes having acoustic energy confined to the bottom of the stack, while the third and the fourth metal frames 231 and 232, respectively, interact predominantly with the eigenmodes having acoustic energy confined to the bottom of the stack. However, since the main structural discontinuity in the acoustic resonator 100L occurs at the edge of the top electrode 103a, the eigenmodes with acoustic energy predominantly confined to the top of the stack are excited during the electrical driving of the acoustic resonator 100L. As a result, the third and fourth metal frames 231 and 232, respectively, formed on the top surface of the top electrode 103 will have a larger impact on suppressing eigenmodes than the first and second metal frames 107 and 108, respectively, formed on the bottom surface of the bottom electrode 106. However, the first and second metal frames 107 and 108, respectively, have a larger impact on thermal management than the third and fourth metal frames 231 and 232, respectively. Consequently, the top metal frames 231 and 232 provide improved performance in terms of suppressing eigenmodes while the bottom metal frames 107 and 108 improve performance in terms of heat transfer.

The top electrode 103 has the add-on metal layer 114 formed on its top surface that thickens the portion of the top electrode 103 that is in between the dashed lines 236. Thickening this portion of the top electrode 103 and forming the metal frames 107, 108, 231 and 232 on the top and bottom electrodes 103 and 106, respectively, results in the stack being thinnest in locations in between dashed lines 235 and 236. The result is that these areas of the stack are high velocity regions that have the highest resonance frequency of all of the regions of the stack, which improves performance of the device 100L for frequencies that are below the series resonance frequency of the device 100L.

Similar to the configuration shown in FIG. 14, one or more top metal frames may be added to the top surface of the top electrode of the acoustic resonators 100C-100K shown in FIGS. 5-13, respectively, to provide performance benefits similar to those described above with reference to FIG. 14. In the interest of brevity, the acoustic resonators 100C-100K modified to include top metal frames ware not explicitly shown and described herein because persons of skill in the art will understand how to make such modifications in view of the teachings provided herein.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered.

In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator device, comprising:
a bottom electrode disposed on a substrate over an air cavity, the bottom electrode having a central region and a peripheral region;
a piezoelectric layer disposed on the bottom electrode;
a top electrode disposed on the piezoelectric layer, an overlap between the top electrode, the piezoelectric layer and the bottom electrode over the air cavity defining a main membrane region;
a first metal frame disposed on a bottom surface of the bottom electrode, the first metal frame having a first side and a second side, the first side being opposite the second side, the first metal frame having a thickness that ranges from about 10% to about 75% of a thickness of the bottom electrode in the central region of the bottom electrode, wherein the first side of the first metal frame extends laterally from a location that is outside of the main membrane region to a location that is within the main membrane region; and
at least one air-bridge disposed between the top electrode and the piezoelectric layer.

2. The acoustic resonator device of claim 1, wherein the first metal frame has a thickness that ranges from about 500 Angstrom to about 5,000 Angstrom.

3. The acoustic resonator device of claim 1, wherein the first side of the first metal frame extends laterally from a location that is outside of the main membrane region to a location that is at an edge of the main membrane region.

4. The acoustic resonator device of claim 1, further comprising:
a second metal frame disposed on a bottom surface of the bottom electrode, the second metal frame having a first side that extends laterally from an inner edge of the first side of the first metal frame to an outer edge of the central region of the bottom electrode, the second metal frame having a second side that extends laterally from an inner edge of the second side of the first metal frame to an outer edge of the central region of the bottom electrode.

5. The acoustic resonator device of claim 4, wherein the second metal frame has a thickness that ranges from about 10% to about 70% of the thickness of the bottom electrode in the central region.

6. The acoustic resonator device of claim 4, wherein the first metal frame has a thickness that is about double the thickness of the second metal frame.

7. The acoustic resonator device of claim 4, wherein the thickness of the second metal frame ranges from about 500 Angstrom to about 5,000 Angstrom.

8. The acoustic resonator device of claim 1, wherein the second side of the first metal frame extends laterally from a location that is outside of the main membrane region to a location that is within the main membrane region.

9. The acoustic resonator device of claim 1, wherein the second side of the first metal frame extends laterally from a location that is within the main membrane region to another location that is within the main membrane region.

10. The acoustic resonator device of claim 1, further comprising:
an air-wing formed between the top electrode and the piezoelectric layer.

11. The acoustic resonator device of claim 1, further comprising:
at least a first air-bridge formed between the bottom electrode and the piezoelectric layer.

12. The acoustic resonator device of claim 11, further comprising:
at least a second air-bridge formed between the bottom electrode and the piezoelectric layer.

13. The acoustic resonator device of claim 4, further comprising:
a third metal frame disposed on a top surface of the top electrode, the third metal frame having a first side and a second side, the first side of the third metal frame being opposite the second side of the third metal frame.

14. The acoustic resonator device of claim 13, further comprising:
a fourth metal frame disposed on the top surface of the top electrode, the fourth metal frame having a first side that extends laterally from an inner edge of the first side of the third metal frame to an outer edge of a central region of the top electrode, the fourth metal frame having a second side that extends laterally from an inner edge of the second side of the third metal frame to an outer edge of the central region of the top electrode.

15. The acoustic resonator device of claim 1, further comprising:
at least a first air-bridge formed within the piezoelectric layer.

16. An acoustic resonator device, comprising:
a bottom electrode disposed on a substrate over an air cavity, the bottom electrode having a central region and a peripheral region;
a piezoelectric layer disposed on the bottom electrode;
a top electrode disposed on the piezoelectric layer, an overlap between the top electrode, the piezoelectric layer and the bottom electrode over the air cavity defining a main membrane region;
a first metal frame disposed on a bottom surface of the bottom electrode, the first metal frame having a first side and a second side, the first side being opposite the second side; and
a second metal frame disposed on a bottom surface of the bottom electrode, the second metal frame having a first side that extends laterally from an inner edge of the first side of the first metal frame to an outer edge of the central region of the bottom electrode, the second metal frame having a second side that extends laterally from an inner edge of the second side of the first metal frame to an outer edge of the central region of the bottom electrode.

17. The acoustic resonator device of claim 16, wherein the first metal frame has a thickness that ranges from about 10% to about 75% of a thickness of the bottom electrode in the central region of the bottom electrode, and wherein the thickness of the first metal frame is about double the thickness of the second metal frame.

18. The acoustic resonator device of claim 17, further comprising:
at least one of an air-bridge formed between the top electrode and the piezoelectric layer, an air-wing formed between the top electrode and the piezoelectric layer, an air-bridge formed between the bottom electrode and the piezoelectric layer, an air-bridge formed within the piezoelectric layer, an air-bridge formed within the top electrode, and an air bridge formed within the bottom electrode.

19. An acoustic resonator device, comprising:
a bottom electrode disposed on a substrate over an air cavity, the bottom electrode having a central region and a peripheral region;
a piezoelectric layer disposed on the bottom electrode;
a top electrode disposed on the piezoelectric layer, an overlap between the top electrode, the piezoelectric layer and the bottom electrode over the air cavity defining a main membrane region;
a first metal frame disposed on a bottom surface of the bottom electrode, the first metal frame having a first side and a second side, the first side being opposite the second side, the first metal frame having a thickness that ranges from about 10% to about 75% of a thickness of the bottom electrode in the central region of the bottom electrode;
at least one air-bridge disposed between the top electrode and the piezoelectric layer; and
an air-wing formed between the top electrode and the piezoelectric layer.

20. The acoustic resonator device of claim 19, wherein the first metal frame has a thickness that ranges from about 500 Angstrom to about 5,000 Angstrom.

21. The acoustic resonator device of claim 19, wherein the first side of the first metal frame extends laterally from a location that is outside of the main membrane region to a location that is at an edge of the main membrane region.

22. The acoustic resonator device of claim 19, further comprising:
a second metal frame disposed on a bottom surface of the bottom electrode, the second metal frame having a first side that extends laterally from an inner edge of the first side of the first metal frame to an outer edge of the central region of the bottom electrode, the second metal frame having a second side that extends laterally from an inner edge of the second side of the first metal frame to an outer edge of the central region of the bottom electrode.

23. The acoustic resonator device of claim 22, wherein the second metal frame has a thickness that ranges from about 10% to about 70% of the thickness of the bottom electrode in the central region.

24. The acoustic resonator device of claim 22, wherein the first metal frame has a thickness that is about double the thickness of the second metal frame.

25. The acoustic resonator device of claim 22, wherein the thickness of the second metal frame ranges from about 500 Angstrom to about 5,000 Angstrom.

26. The acoustic resonator device of claim 19, wherein the second side of the first metal frame extends laterally from a location that is outside of the main membrane region to a location that is within the main membrane region.

27. The acoustic resonator device of claim 19, wherein the second side of the first metal frame extends laterally from a location that is within the main membrane region to another location that is within the main membrane region.

28. The acoustic resonator device of claim 19, further comprising:
at least a first air-bridge formed between the bottom electrode and the piezoelectric layer.

29. The acoustic resonator device of claim 28, further comprising:
at least a second air-bridge formed between the bottom electrode and the piezoelectric layer.

30. The acoustic resonator device of claim 22, further comprising:
a third metal frame disposed on a top surface of the top electrode, the third metal frame having a first side and a second side, the first side of the third metal frame being opposite the second side of the third metal frame.

31. The acoustic resonator device of claim 30, further comprising:
a fourth metal frame disposed on the top surface of the top electrode, the fourth metal frame having a first side that extends laterally from an inner edge of the first side of the third metal frame to an outer edge of a central region of the top electrode, the fourth metal frame having a second side that extends laterally from an inner edge of the second side of the third metal frame to an outer edge of the central region of the top electrode.

* * * * *